(12) United States Patent
Cok

(10) Patent No.: US 7,026,597 B2
(45) Date of Patent: Apr. 11, 2006

(54) OLED DISPLAY WITH INTEGRATED ELONGATED PHOTOSENSOR

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 221 days.

(21) Appl. No.: 10/409,841

(22) Filed: Apr. 9, 2003

(65) Prior Publication Data

US 2004/0200953 A1   Oct. 14, 2004

(51) Int. Cl.
*G01J 1/44* (2006.01)
(52) U.S. Cl. ............... 250/214 AL; 345/207; 345/77
(58) Field of Classification Search ......... 250/214 B, 250/214 AL, 205; 345/76–81; 348/602; 245/207
See application file for complete search history.

(56) References Cited

U.S. PATENT DOCUMENTS 5,726,672 A * 3/1998 Hernandez et al. .......... 345/22
6,144,165 A * 11/2000 Liedenbaum ............ 315/169.3
6,489,631 B1 12/2002 Young et al. .................. 257/59
6,509,574 B1 1/2003 Yuan et al. .................. 250/551
2003/0169590 A1* 9/2003 Sorli et al. .................. 362/154

FOREIGN PATENT DOCUMENTS

| EP | 1 194 013 A1 | 4/2002 |
| JP | 2002-072920 | * 3/2002 |
| JP | 2002297096 A | 10/2002 |

* cited by examiner

*Primary Examiner*—Thanh X. Luu
(74) *Attorney, Agent, or Firm*—Andrew J. Anderson; Thomas H. Close

(57) ABSTRACT

An OLED display with a photosensor includes a substrate; a display area comprising an array of addressable OLEDs formed on the substrate; and an elongated photosensor formed on the substrate and located along an edge of the display area and responsive to ambient illumination to generate a feedback signal in response thereto, the elongated photosensor having a first conductive electrode that extends the length of the photosensor and a second conductive electrode.

23 Claims, 5 Drawing Sheets

OLED DISPLAY WITH INTEGRATED ELONGATED PHOTOSENSOR

FIELD OF THE INVENTION

The present invention relates to solid state flat panel OLED displays and more particularly to such display devices having photosensors for sensing ambient illumination.

BACKGROUND OF THE INVENTION

Solid state organic light emitting diode (OLED) image display devices are of great interest as a superior flat panel digital display device. These display devices utilize current passing through thin films of organic material to generate light. The color of light emitted and the efficiency of the energy conversion from current to light are determined by the composition of the organic thin film material.

When viewed in a dark environment (little ambient radiation), a display need not be as bright as when viewed in a lighter environment (more ambient radiation). If the display device light output is recalibrated periodically, it can maintain a fixed difference between the ambient and displayed light even if the ambient light changes. This can, in turn, increase display device lifetime by reducing unnecessary display brightness in a dark environment and increase display device visibility in a bright environment.

The use of photosensors with displays to detect ambient light and adjusting the brightness of the display in response to ambient illumination is known. For example, see JP2002-297096-A, which describes a circuit for providing ambient compensation to an electroluminescent display. However, as implemented, the sensor is separate from the display and senses the light at a single point. This increases the cost, number of components, and size of the device; reduces the sensitivity of the sensor; and does not directly measure the light incident on the display itself.

It is known to integrate a light sensor on a display device for the purpose of sensing light emitted from the display device itself. See for example, U.S. Pat. No. 6,489,631 issued Dec. 3, 2002 to Young et al., which describes a display having integrated photosensors for sensing light emitted by a light emitting element of the display. However, the arrangement of the sensor coupled with a light emitter limits the size of the photosensor and its ability to sense ambient light.

There is a need therefore for an improved photosensor for the detection of ambient light within an OLED display.

SUMMARY OF THE INVENTION

The need is met according to the present invention by providing an OLED display with a photosensor that includes a substrate; a display area comprising an array of addressable OLEDs formed on the substrate; and an elongated photosensor formed on the substrate and located along an edge of the display area and responsive to ambient illumination to generate a feedback signal in response thereto.

ADVANTAGES

The advantages of this invention are an emissive digital image display device with improved ambient illumination detection and simplified construction.

DETAILED DESCRIPTION OF THE INVENTION

Figure 1:
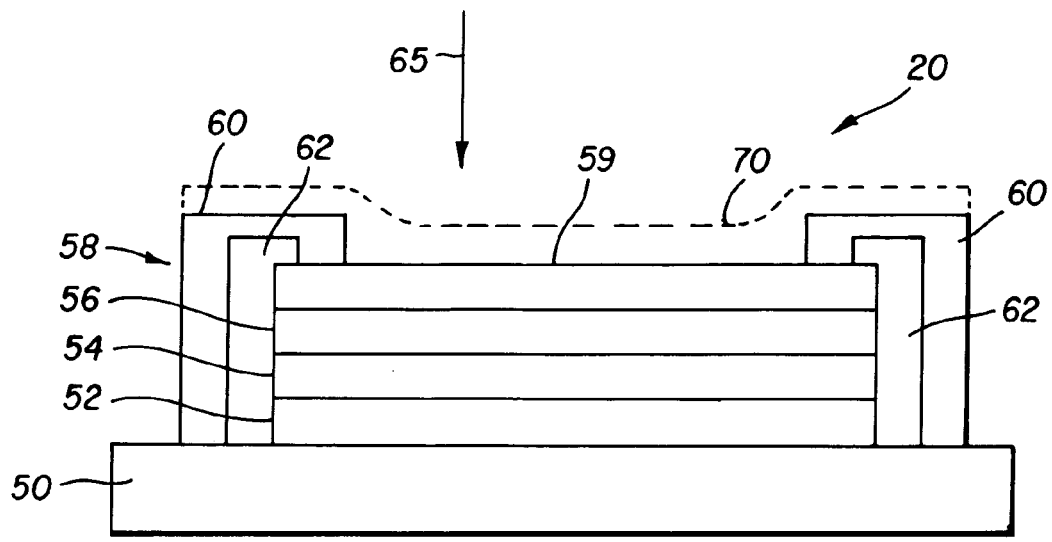
FIG. 1 is a schematic diagram of one embodiment of a photosensor employed with a display device according to the present invention.

Referring to FIG. 1, one embodiment of an elongated photosensor 20 for use with the present invention in a top emitter OLED display is shown in cross-section across a narrow dimension of the elongated photosensor. The elongated photosensor 20 has a first electrode 52 located over the substrate 50, a first semiconductor 54 with a first conductivity type (e.g. n-type) deposited on and in electrical contact with the first electrode 52, a second semiconductor 56 with a second conductivity type (e.g. p-type) deposited on and in electrical contact with the first semiconductor 54, and a second electrode 58 located over and in electrical contact with the second semiconductor 56. In this embodiment, the second electrode 58 includes a transparent portion 59 with limited conductivity and an opaque portion 60 with higher conductivity and is in electrical contact with the second semiconductor layer 56 along its length. The second electrode 58 is insulated from the first electrode 52 by an insulating layer 62. Light 65 is incident on the transparent portion 59 of electrode 58. The opaque portion 60 of electrode 58 completely surrounds the photosensor 20.

Figure 2:
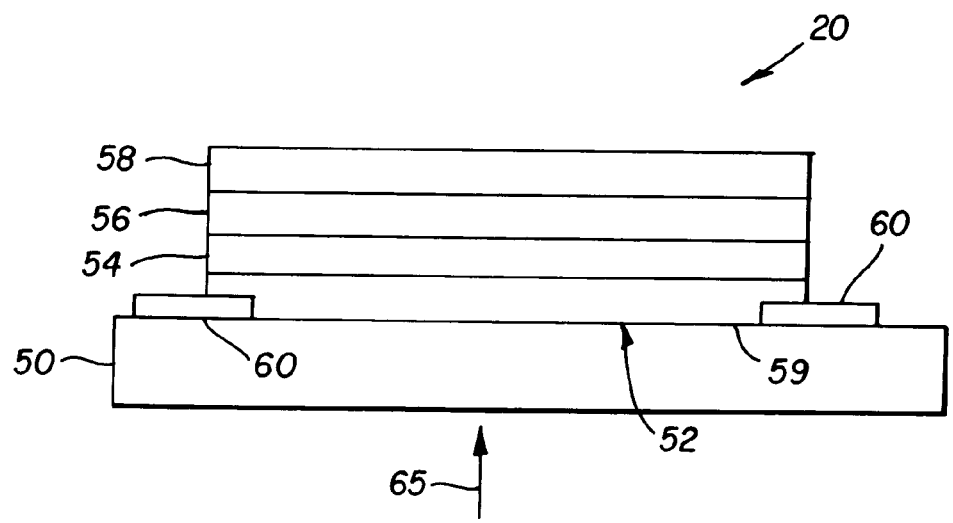
FIG. 2 is a schematic diagram of an alternative embodiment of a photosensor according to the present invention.

Referring to FIG. 2, an alternative embodiment of a photosensor for use in an OLED bottom emitting display is shown in cross-section and includes an electrode 52 having a less conductive transparent first portion 59 and a more conductive opaque portion 60. The second electrode 58, which may be opaque and highly conductive, is deposited above the semiconductor layers 54 and 56 and in electrical contact with the second semiconductor layer 56. Light 65 is incident on the transparent portion 59 of electrode 52.

The photosensors can be manufactured using thin film technology using silicon or organic semiconductors as is known in the art. Thin film devices technology is useful since it is also used in typical OLED active matrix displays.

To maximize the available signal from the photosensor and to complement the conventional deposition process of conventional OLED electrodes, it is helpful to arrange the photosensor semiconductor materials and electrodes in flat sheets as shown in FIGS. 1 and 2. The construction of suitable transparent electrodes is known in the OLED display art and can be constructed of, for example, indium tin oxide (ITO) or thin sheets of metals such as silver or aluminum or thin sheets of metal compounds such as magnesium silver. Opaque electrodes are also well known in the art and can be made of, for example, aluminum, copper or silver.

The photosensors 20 of the present invention are used to best advantage when the junction between the semiconductor layers 54 and 56 are exposed to the maximum flux of ambient radiation. Hence, the semiconductor layers are arranged in layers parallel to the substrate. Because the signal from the photosensors is relatively small, the layers may extend over the surface of the display as far as possible. The electrode that is not transparent can be made as thick as desired to carry as much current at as low a resistivity as needed. However, the transparent portion 59 of the electrodes 52 or 58 will have higher resistivity than desired either because of its composition (for example indium tin oxide) or because of the thinness of the electrode necessary for transparency. To reduce the overall resistivity of the electrode, the opaque portion 60 is located in electrical contact with the transparent portion 59 of the electrodes 52 or 58 along the length of the semiconductor layers and is insulated from the other layers as necessary.

Figure 3:
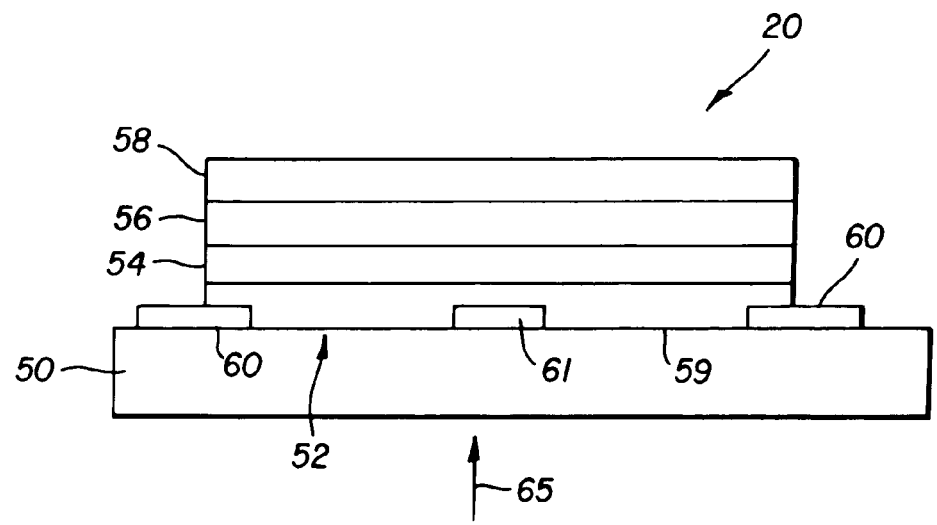
FIG. 3 is a schematic diagram of further embodiment of a photosensor according to the present invention.
Figure 4:
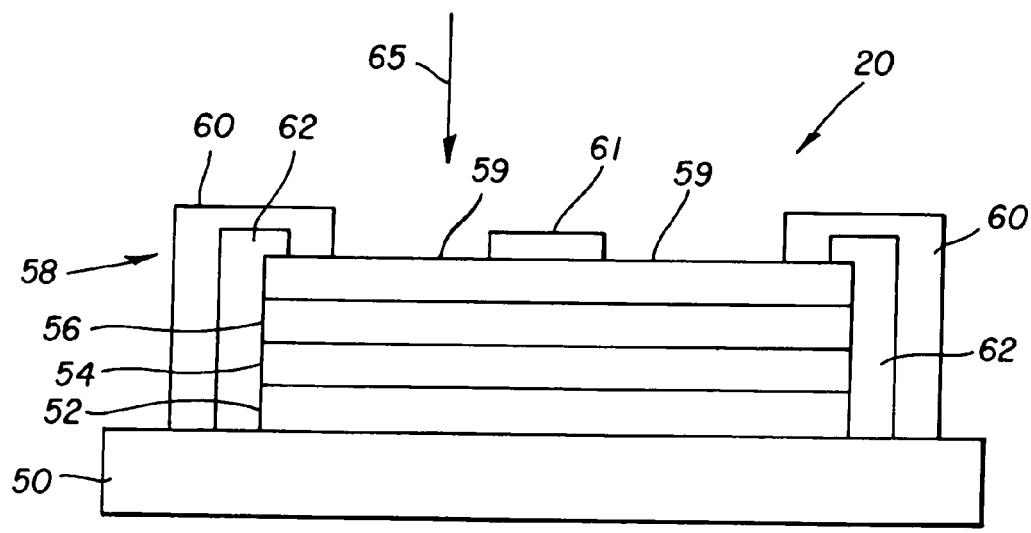
FIG. 4 is a schematic diagram of a still further embodiment of a photosensor according to the present invention.

In an alternative arrangement, an additional opaque more highly conductive portion 61 of electrode 52 extends through a central region of the photosensor as shown in FIG. 3 (for a bottom emitter) and of electrode 58 in FIG. 4 (for a top emitter). The photosensor area under the opaque portions 60 of an electrode will be shadowed from incident light but the opaque electrode provides a closer and higher conductivity connection to the semiconductors, improving the accuracy of the device. In these cases, the opaque portions 60 and 61 of an electrode are electrically connected in common for example at one end of the elongated photosensor (not shown).

The configurations of FIGS. 1–4 have the advantage of exposing a relatively large area to ambient illumination, thereby maximizing the photo signal without significantly increasing the size of the display. Moreover, the distance from the relatively resistive transparent electrode to a more conductive opaque region is reduced by extending the more highly conductive portion of the electrode along the entire length of the photosensor thereby reducing the overall resistance of the electrode and improving measurement accuracy and response.

Figure 6:
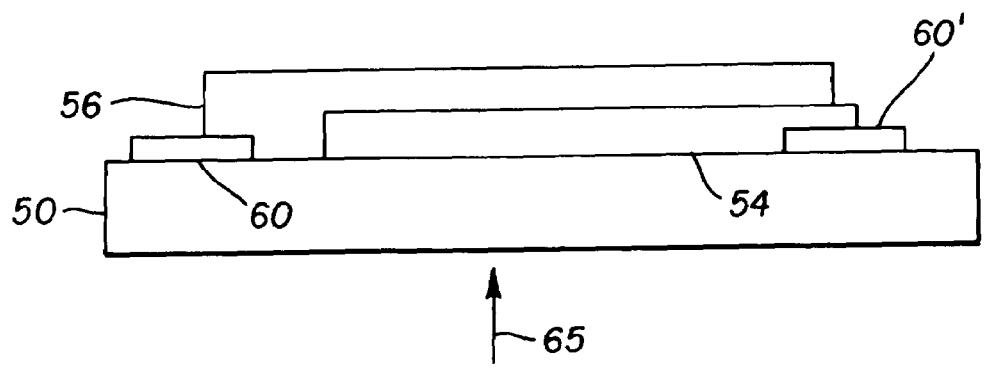
FIG. 6 is a schematic diagram of a still further embodiment of a photosensor according to the present invention.

In an alternative embodiment, the electrode on the light receiving side of the photosensor is opaque and highly conductive, but does not extend over the entire surface of the photosensor. Referring to FIG. 6, a first highly conductive opaque electrode 60 is located in electrical contact along the length of the semiconductor layer 56 and a second highly conductive opaque electrode 60' is located in electrical contact along the length of the semiconductor layer 54. This configuration has the advantage of improved light exposure since no imperfectly transparent electrode is present to absorb light, but the electrodes 60 and 60' are further removed from the semiconductor junction, reducing the accuracy of the device. This arrangement also has the advantage that both electrodes 60 and 60' can be formed in a single processing step.

Means to deposit multiple layers of materials, such as conductors and semiconductors, are well known in the art. Arranging the photosensor layers of the present invention on additional layers in the display is considered within the scope of the present invention.

Figure 5:
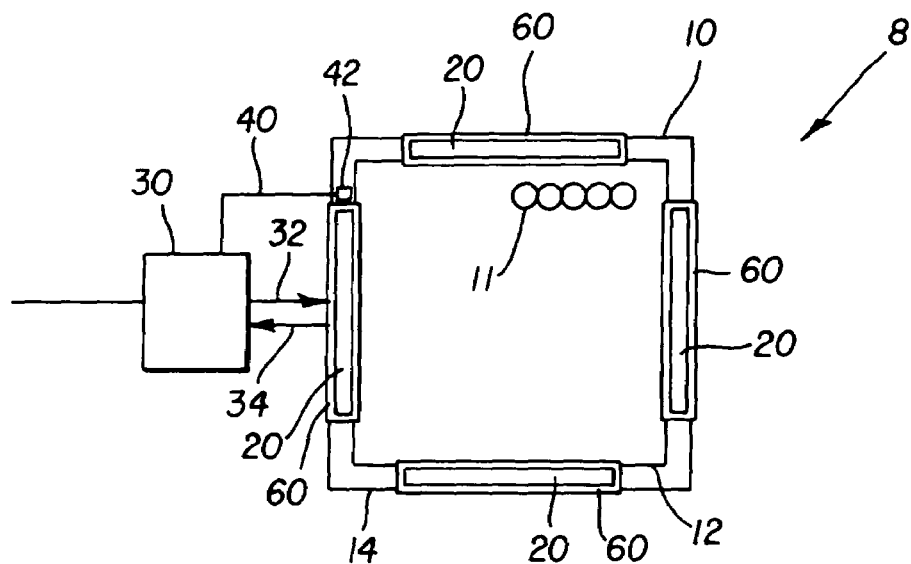
FIG. 5 is a schematic diagram of one embodiment of a display device according to the present invention.

Referring to FIG. 5, a display 10 having a display area 12 and integrated elongated photosensors 20 for sensing ambient light according to the present invention is shown. The integrated elongated photosensors 20 are located on the periphery 14 of the display area 12. For example, at an edge of the display area 12 a photosensor 20 of rectangular shape and having a large aspect ratio may be located so that the long edge of the photosensor 20 is located along the edge of the display area 12. Opaque portions 60 of an electrode are arranged along the edges of the photosensors 20.

The signal from a thin film photosensor 20 is directly related to the area that it covers and the ambient radiation incident upon it. By increasing the area by elongating the integrated photosensor 20, the signal from the photosensor 20 may be increased without significantly increasing the size of the display.

The photosensors 20 can be electrically connected in common to provide one integrated photo signal or they can be separately addressed. A greater number or size of integrated photosensors 20 can increase the signal, thereby improving the responsiveness of the ambient light detection. Moreover, the signal will be more representative of the overall ambient illumination incident on the display since, if a portion of the display is shadowed, having several sensors can provide several signals that can be averaged to produce an overall average of the illumination incident on the display area. Indeed, the location and shape of any shadows falling upon the display area 12 may be determined to a limited extent, thereby providing further information that can be used to optimize the performance of the display.

The present invention may be used in both top and bottom emitting OLED structures. The thin film structures used for active matrix OLED displays may be employed to form the photosensors and to provide circuitry to generate and process suitable control signals for the photosensors. The same power and control signal methods may be used to operate the display. There are also a variety of ways in which the photosensors can be connected that depend on various factors such as the layout of the display and the conductivity of the electrodes and signal lines.

Figure 7:
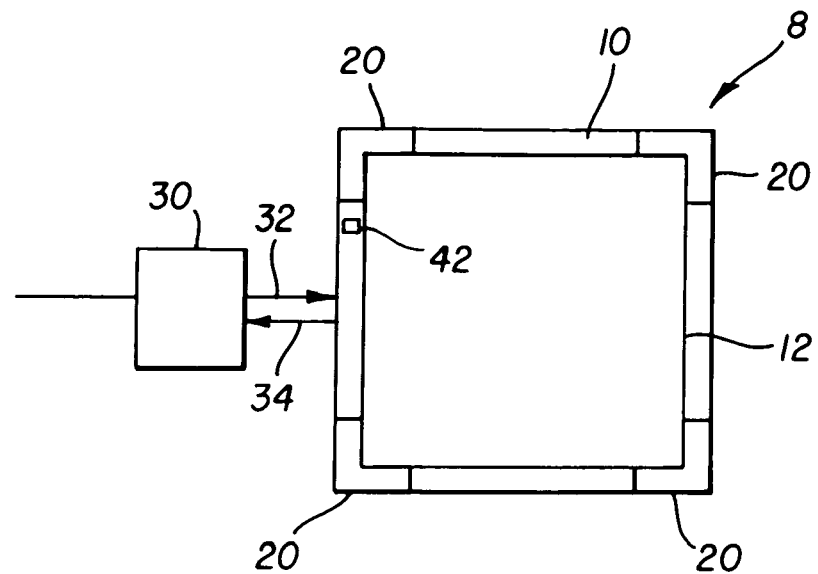
FIG. 7 is a schematic diagram of an alternative embodiment of a display device according to the present invention.
Figure 8:
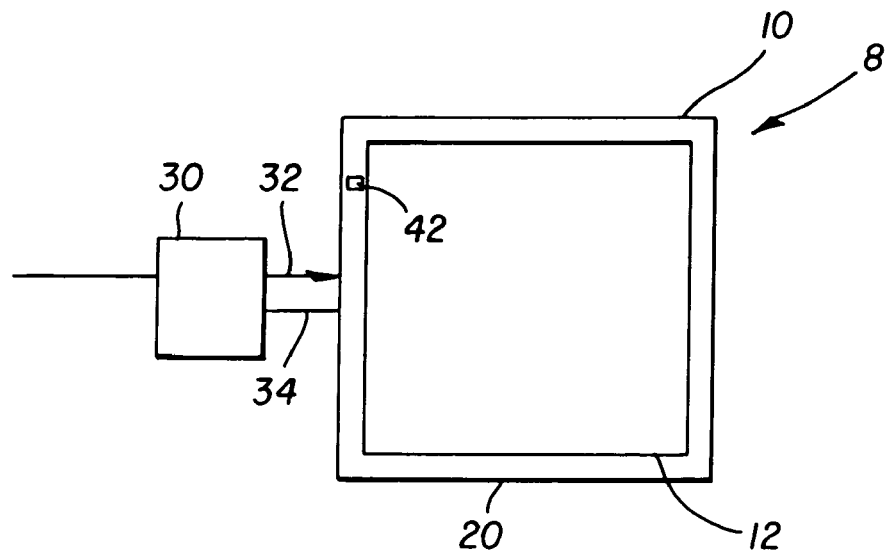
FIG. 8 is a schematic diagram of a further alternative embodiment of a display device according to the present invention.

The photosensor elements may be selected individually (as are the display pixel elements) or in groups. Existing address and signal lines may be used to select or reset elements using existing electronic control methods. Groups of photosensor elements can be joined either physically or logically to provide a measure of incident light over larger areas thus reducing both the specificity of the information and the need for supporting logic and interconnects. In one case, the photosensors 20 might be arranged around the corners of a display area as shown in FIG. 7. In the extreme case, as shown in FIG. 8, the photosensor 20 may comprise one large element that surrounds the display whose signal represents the ambient light incident on the display device as a whole.

It is also possible to use the present invention to obtain information concerning the color of the ambient illumination. By utilizing color filters located between the photosensor and the ambient light, the ambient light may be filtered. Referring back to FIG. 1, a color filter layer 70 is deposited upon the second electrode 58. This arrangement is suitable for a top emitter configuration wherein ambient light shines through the second electrode 58. Alternatively, in a bottom emitter configuration, a color filter can be placed beneath the first electrode 52 to filter ambient radiation (not shown). Such color filter deposition techniques are well known in the art and have been publicly demonstrated. If a plurality of photosensors are provided with different filters, the signals from the photosensors can be used to optimize the display, for example by adjusting the color or white point of the display. In this case only, photosensors with color filters of the same color would be connected in parallel.

The present invention operates as follows. Referring to FIG. 5, a display system 8 includes a display 10 and a controller 30 which drives the display. The controller 30 writes data to the display area 12, and to particular display elements 11 within the display area using, data, address, and control signals 32. The controller 30 sends a reset signal 40 to a photosensor control circuit 42 integrated on the substrate with the display elements. The photosensor control circuit 42 may include additional circuit elements (not shown) or may simply provide a connection to the photosensor areas 20.

Figure 9:
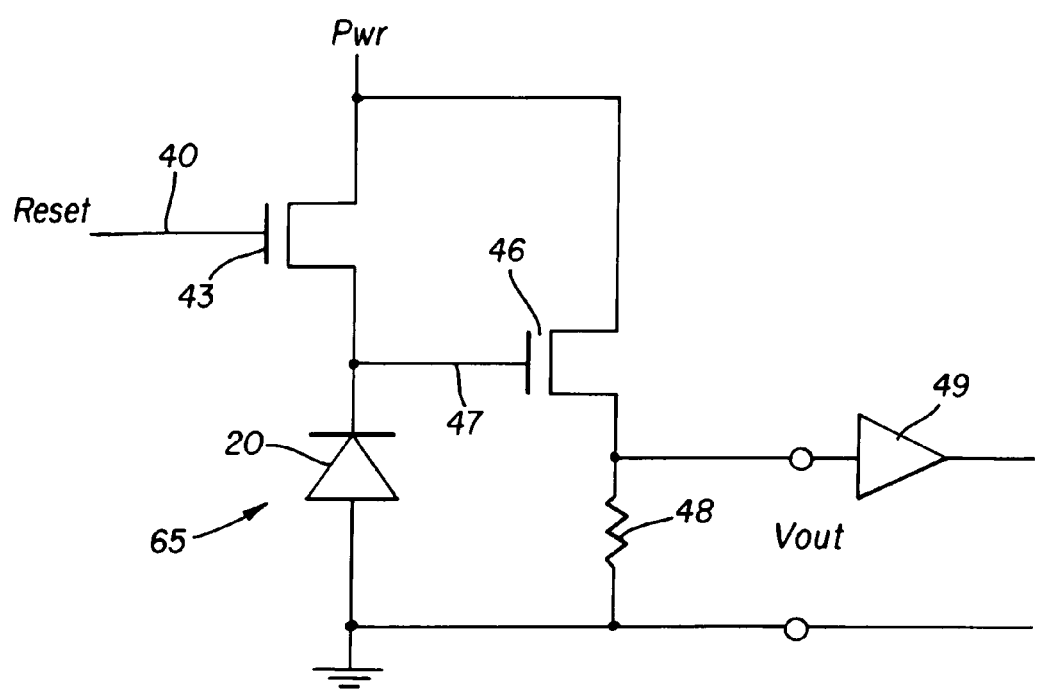
FIG. 9 is a schematic diagram of a prior art circuit for operating the photosensor of the present invention.

Referring to FIG. 9, a prior art circuit for photosensor control is shown and includes a reset signal 40, a switch transistor 43, a photosensor 20 that provides a signal 47 to an amplifier 46 whose current or voltage across a load 48 which can be converted to a digital signal for example with an analog to digital converter 49. A feedback signal generated by the photosensor(s) within the display is passed to the control circuit 42 (see FIG. 5) and then through signal 34 to the controller. The controller 30 modifies the signals 32 to appropriately modify the output of the display elements 11 to compensate for the ambient illumination. It may be desirable to average the feedback signal over time to reduce flicker from rapidly changing ambient illumination. Alternative prior art circuits for detecting the signal from the photosensor are known and may measure different responses from the photosensor, for example the current resulting from exposure to ambient light.

The light emitting display is an organic light emitting diode (OLED) display that includes multiple supporting layers such as light emitting layers, hole injection, hole transport, electron injection, and electron transport layers as is known in the art. The photosensor electrodes and semiconductor materials may be deposited in a common step with the display circuitry and may include identical materials to simplify processing and manufacturing.

The photosensor control circuit 42 can be integrated directly onto the same substrate as the display device or it can be implemented externally to the display. In general, higher performance and greater accuracy can be achieved by integrating the circuitry directly with the display device but this may not be desirable for all display devices.

In a preferred embodiment, the invention is employed in a device that includes Organic Light Emitting Diodes (OLEDs) which are composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light emitting displays can be used to fabricate such a device.

The invention has been described in detail with particular reference to certain preferred embodiments thereof, but it will be understood that variations and modifications can be effected within the spirit and scope of the invention.

PARTS LIST 8 display system
10 display
11 display elements
12 display area
14 periphery
20 photosensor
30 controller
32 control signals
34 signal
40 reset signal
42 photosensor control circuit
43 switch transistor
46 amplifier
47 signal
48 load
49 digital converter
50 substrate
52 first electrode
54 first semiconductor
56 second semiconductor
58 second electrode
59 transparent portion
60 opaque portion
60' opaque electrode
61 highly conductive portion
62 insulating layer
65 light
70 color filter

What is claimed is:

1. An OLED display with a photosensor, comprising:
   a) a substrate;
   b) display area comprising an array of addressable OLEDs formed on the substrate; and
   c) an elongated photosensor formed on the substrate and located along an edge of the display area and responsive to ambient illumination to generate a feedback signal in response thereto, the elongated photosensor having a first conductive electrode that extends the length of the photosensor and a second conductive electrode;
   wherein the elongated photosensor comprises an elongated semiconductor diode having a first elongated semiconductor of a first conductivity type in electrical contact with the first electrode, and a second elongated semiconductor of a second conductivity type in electrical contact with the first semiconductor and with the second conductive electrode, and further wherein the first electrode includes a conductive opaque portion extending along the length of the photosensor.

2. The OLED display claimed in claim 1, wherein the OLED display is a bottom emitting display and the first electrode is located between the second electrode and the substrate.

3. The OLED display claimed in claim 1, wherein the display area is a rectangular area and further comprising an elongated photosensor located at each edge of the rectangular display area.

4. The OLED display claimed in claim 1, wherein the display area is a rectangular area and the elongated photosensor extends around a corner of the rectangular display area.

5. The OLED display claimed in claim 1, wherein the photosensor surrounds the display area.

6. The OLED display claimed in claim 1, wherein the display includes a plurality of photosensors each of which is individually addressable.

7. The OLED display claimed in claim 1, wherein the display includes a plurality of photosensors which are connected in parallel.

8. The OLED display claimed in claim 1, wherein the first electrode further comprises a less conductive transparent portion located over a light receiving surface of the photosensor.

9. The OLED display claimed in claim 8, wherein the transparent portion of the first electrode comprises transparent thin metal film or ITO.

10. The OLED display claimed in claim 9, wherein the OLED display is a top emitting display and the second electrode is located between the first electrode and the substrate.

11. The OLED display claimed in claim 1, wherein the first electrode extends around the periphery of the photosensor.

12. The OLED display claimed in claim 11, wherein the first electrode further comprises a less conductive transparent portion located over a light receiving surface of the photo sensor.

13. The OLED display claimed in claim 1, wherein the opaque portion extends along an edge of the photosensor.

14. The OLED display claimed in claim 1, wherein the opaque portion extends through a central region of the photosensor.

15. The OLED display claimed in claim 1, wherein the first electrode includes a conductive opaque portion extending beneath a light receiving surface of the photosensor.

16. The OLED display claimed in claim 1, wherein the second electrode extends the length of the photosensor.

17. The OLED display claimed in claim 16, wherein the first electrode includes a conductive opaque portion extending along a long edge of the photosensor.

18. The OLED display claimed in claim 17, wherein the first electrode further comprises a less conductive transparent portion located over a light receiving surface of the photosensor.

19. The OLED display claimed in claim 16, wherein the second electrode includes a conductive opaque portion extending beneath a light receiving surface of the photosensor.

20. The OLED display claimed in claim 1, wherein the photosensor is an organic photosensor.

21. The OLED display claimed in claim 1, wherein the photosensor is a silicon photosensor.

22. The OLED display claimed in claim 1, further comprising a color filter located over a light receiving surface of the photosensor.

23. The OLED display claimed in claim 1, wherein the photosensor is a thin film device.

* * * * *